United States Patent
Kim et al.

(10) Patent No.: US 9,968,964 B2
(45) Date of Patent: May 15, 2018

(54) COATING METHOD USING PARTICLE ALIGNMENT AND PARTICLE COATED SUBSTRATE MANUFACTURED THEREBY

(71) Applicant: AJOU UNIVERSITY INDUSTRY-ACADEMIC COOPERATION FOUNDATION, Suwon-si (KR)

(72) Inventors: Jae Ho Kim, Seongnam-si (KR); Hyo Sop Kim, Suwon-si (KR)

(73) Assignee: AJOU UNIVERSITY INDUSTRY—ACADEMIC COOPERATION FOUNDATION, Suwon (KR)

( * ) Notice: Subject to any disclaimer, the term of this patent is extended or adjusted under 35 U.S.C. 154(b) by 763 days.

(21) Appl. No.: 14/372,118

(22) PCT Filed: Nov. 27, 2013

(86) PCT No.: PCT/KR2013/010830
§ 371 (c)(1),
(2) Date: Jul. 14, 2014

(87) PCT Pub. No.: WO2014/084590
PCT Pub. Date: Jun. 5, 2014

(65) Prior Publication Data
US 2015/0165476 A1    Jun. 18, 2015

(30) Foreign Application Priority Data

Nov. 29, 2012 (KR) .................. 10-2012-0137171

(51) Int. Cl.
B05D 3/12      (2006.01)
B05D 7/02      (2006.01)
(Continued)

(52) U.S. Cl.
CPC ............. B05D 3/12 (2013.01); B05D 7/02 (2013.01); B81C 1/00031 (2013.01);
(Continued)

(58) Field of Classification Search
CPC ... B05D 3/12; B05D 7/02; C09D 1/00; C09D 125/06; B81C 1/00031; B81C 1/0038; Y10T 428/2461
See application file for complete search history.

(56) References Cited

U.S. PATENT DOCUMENTS 6,180,226 B1 *   1/2001   McArdle ................... G03F 7/34
                                                                 156/234
6,402,876 B1 *   6/2002   McArdle ................... G03F 7/34
                                                                 156/247
(Continued)

FOREIGN PATENT DOCUMENTS

FR            2225287 A1 * 11/1974 ............ B41N 1/003
KE    10-2012-0017917 A     2/2012
(Continued)

OTHER PUBLICATIONS

International Search Report dated Mar. 19, 2014 in corresponding International Patent Application No. PCT/KR2013/010830 (3 pages)
(Continued)

Primary Examiner — Nathan L Van Sell

(57) ABSTRACT

Disclosed is a coating method using particle alignment, including preparing a cohesive polymer substrate having a smooth surface; and coating the smooth surface of the cohesive polymer substrate with a plurality of particles while forming recesses respectively corresponding to the particles on the smooth surface of the cohesive polymer substrate by pressing the particles to the cohesive polymer
(Continued)

substrate, so that binding properties between the particles and the cohesive polymer substrate are enhanced.

13 Claims, 11 Drawing Sheets

(51) Int. Cl.
  *B81C 1/00* (2006.01)
  *C09D 1/00* (2006.01)
  *C09D 125/06* (2006.01)

(52) U.S. Cl.
  CPC .............. *B81C 1/0038* (2013.01); *C09D 1/00* (2013.01); *C09D 125/06* (2013.01); *Y10T 428/24612* (2015.01)

(56) References Cited

U.S. PATENT DOCUMENTS

| | | | |
|---|---|---|---|
| 6,631,030 B2 * | 10/2003 | Stevenson | G03B 21/60 359/452 |
| 8,753,526 B2 * | 6/2014 | Yoon | B01D 67/0032 216/39 |
| 2012/0100364 A1 * | 4/2012 | Yoon | B81C 1/00373 428/323 |
| 2012/0114920 A1 | 5/2012 | Yoon et al. | |
| 2013/0017367 A1 * | 1/2013 | Ravagnan | C23C 14/22 428/144 |
| 2013/0149492 A1 | 6/2013 | Yoon et al. | |

FOREIGN PATENT DOCUMENTS

| | | |
|---|---|---|
| KR | 10-2005-0001111 A | 1/2005 |
| KR | 10-2009-0076568 A | 7/2009 |
| KR | 10-2012-0009484 A | 1/2012 |
| KR | 10-2012-0022876 A | 3/2012 |
| WO | WO-2011121017 A1 * | 10/2011 ............. C23C 14/22 |

OTHER PUBLICATIONS

International Search Report dated Mar. 19, 2014 in corresponding International Patent Application No. PCT/KR2013/010830 (3 pages).

* cited by examiner

【Fig.1a】
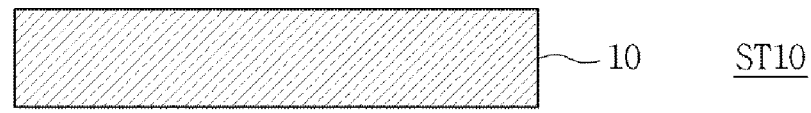
【Fig.1b】
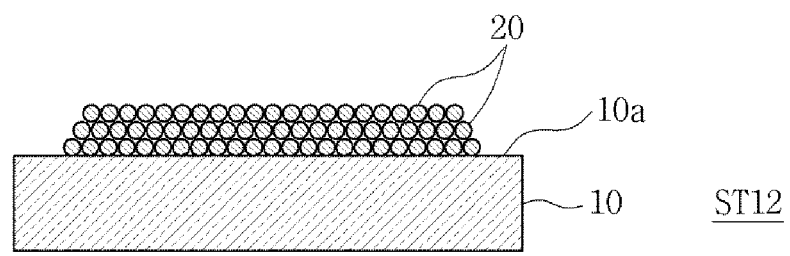
【Fig.1c】
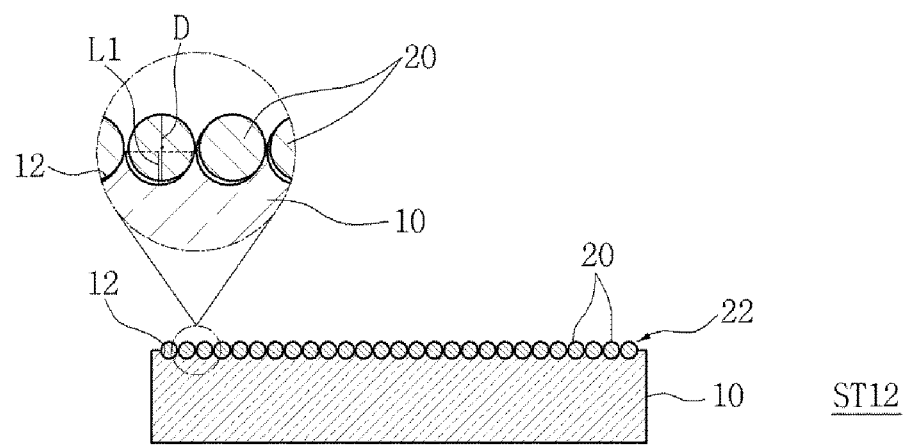
【Fig.2a】
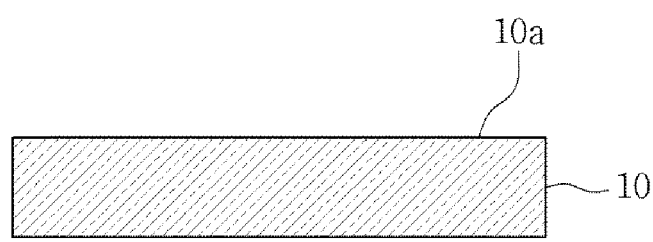

【Fig.2b】
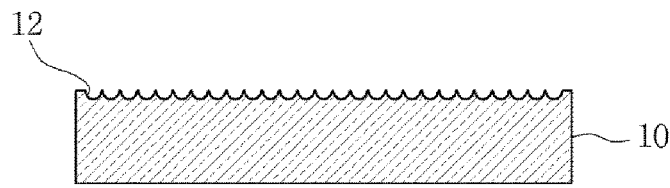
【Fig.3】
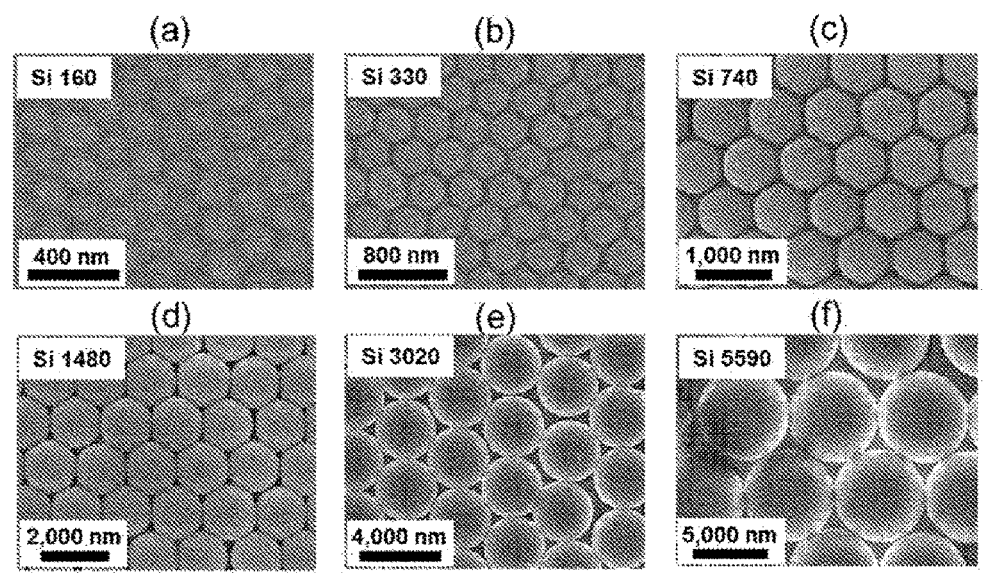
【Fig.4】
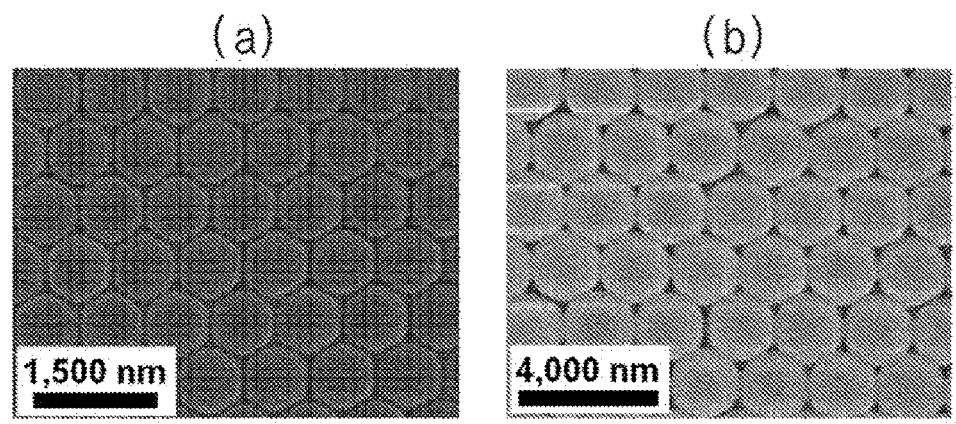

【Fig.5】
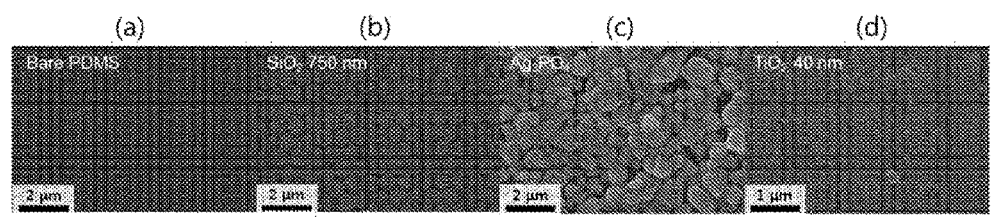
【Fig.6】
(a)　　　(b)　　　(c)　　　(d)

[Fig.7]
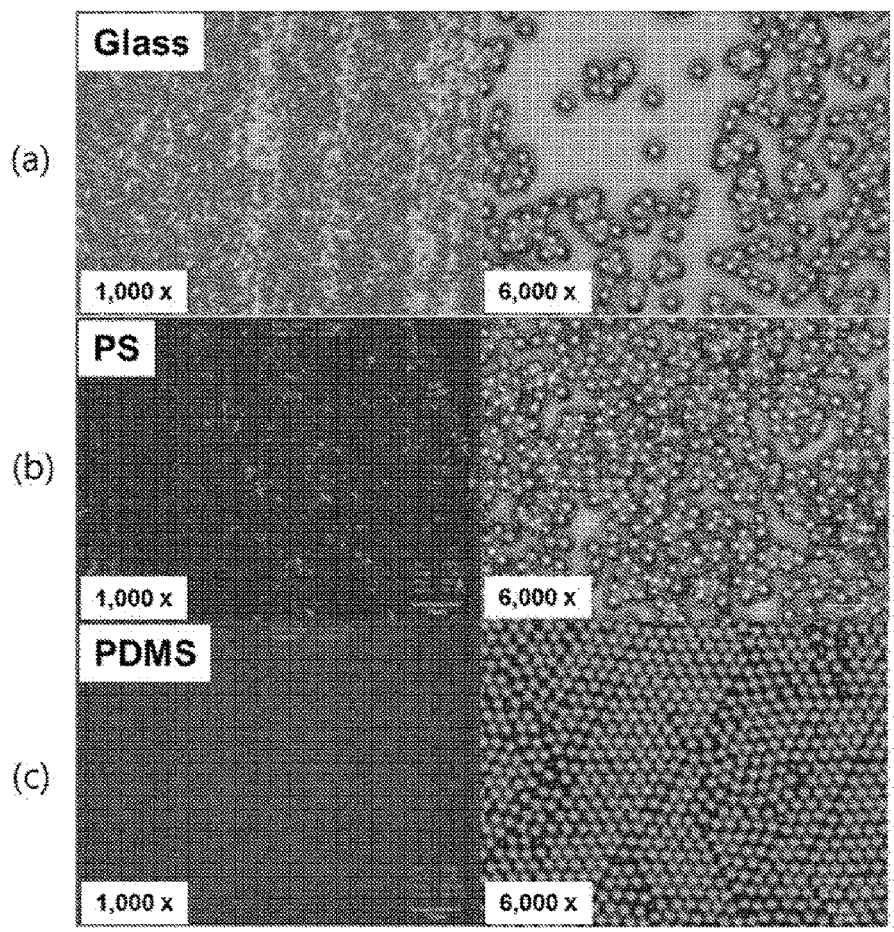
[Fig.8]
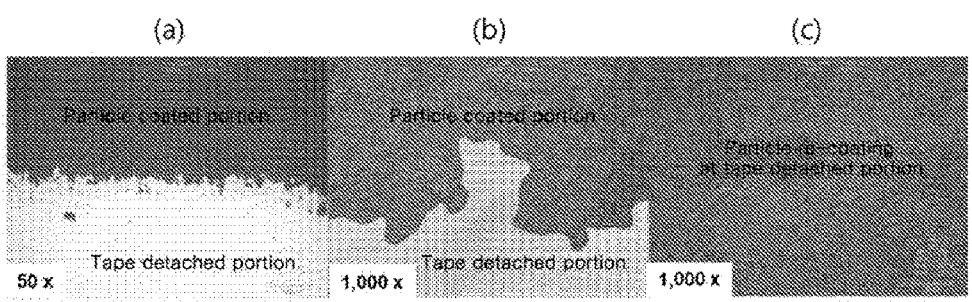

[Fig.9]
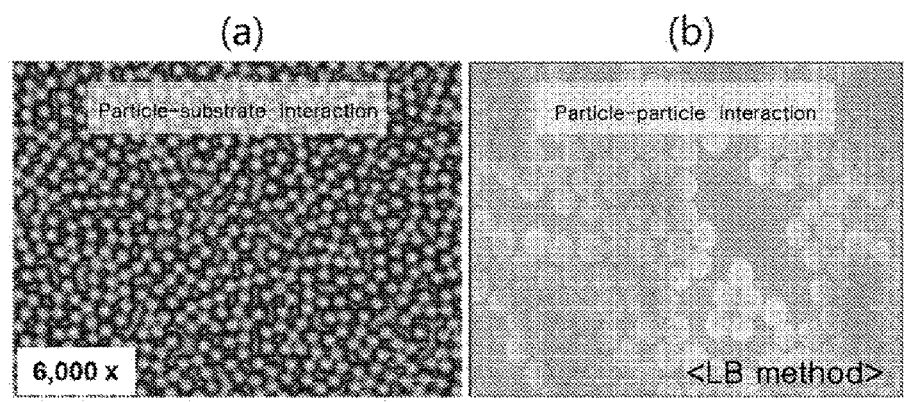
[Fig.10]
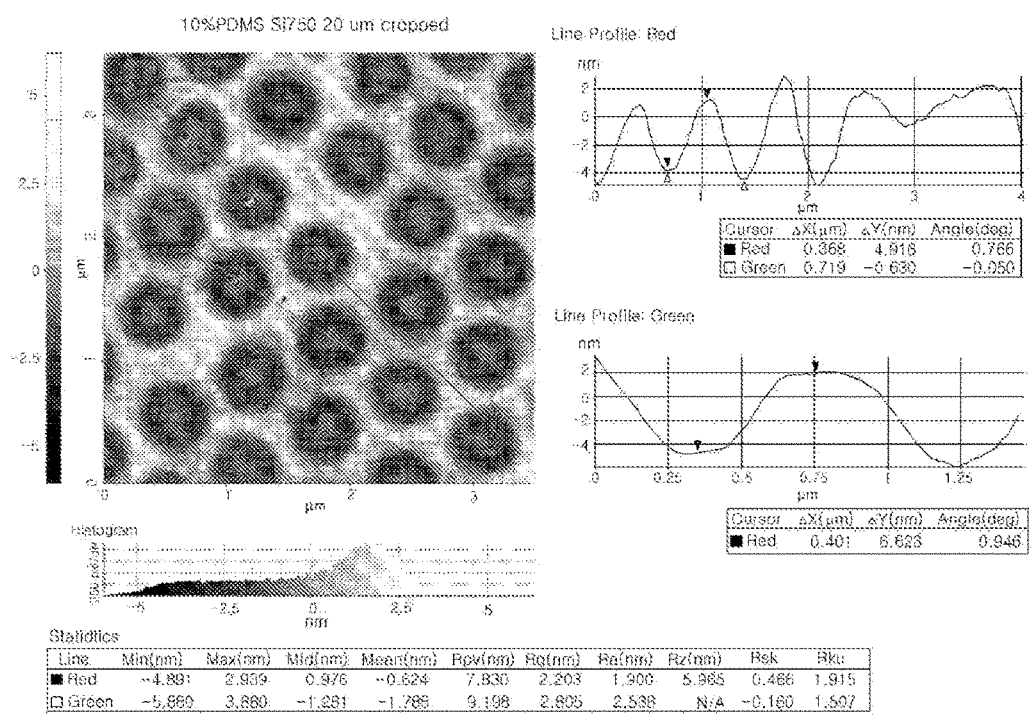

【Fig.11】
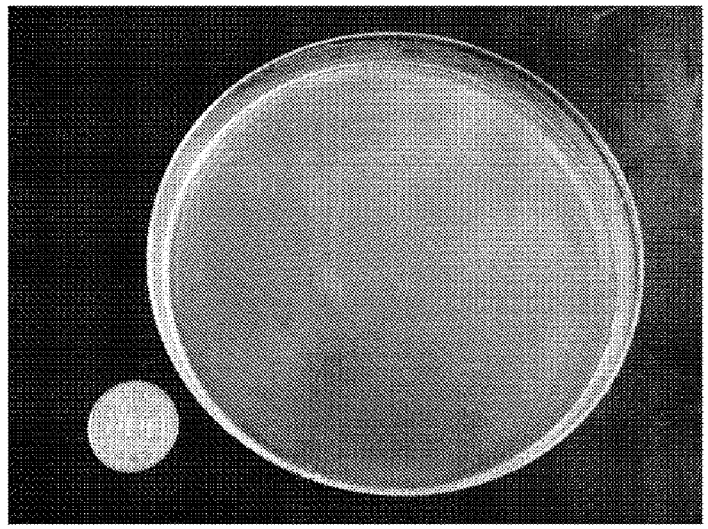
【Fig.12】
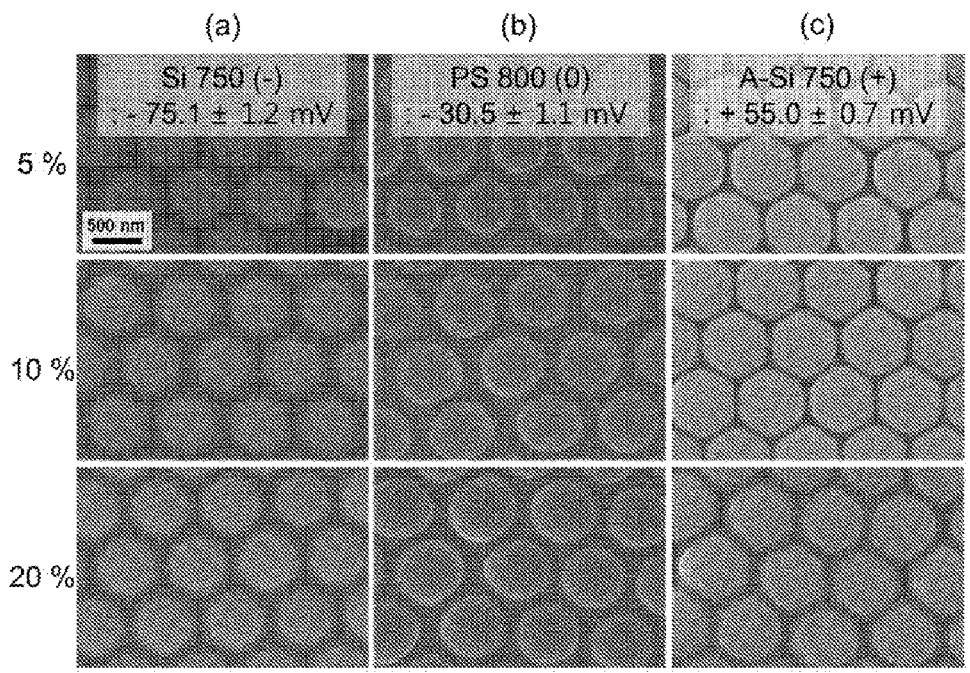

[Fig.13]
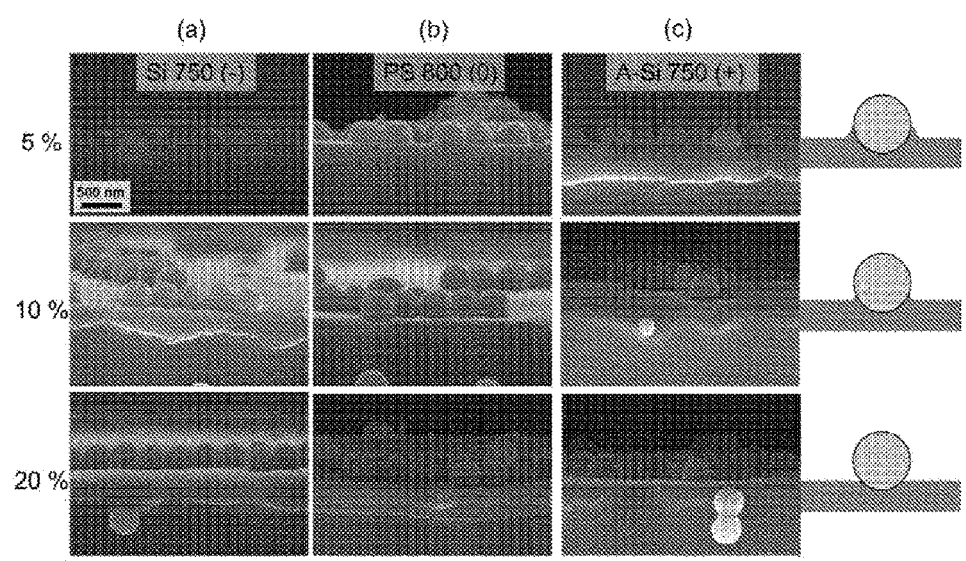

[Fig.14]
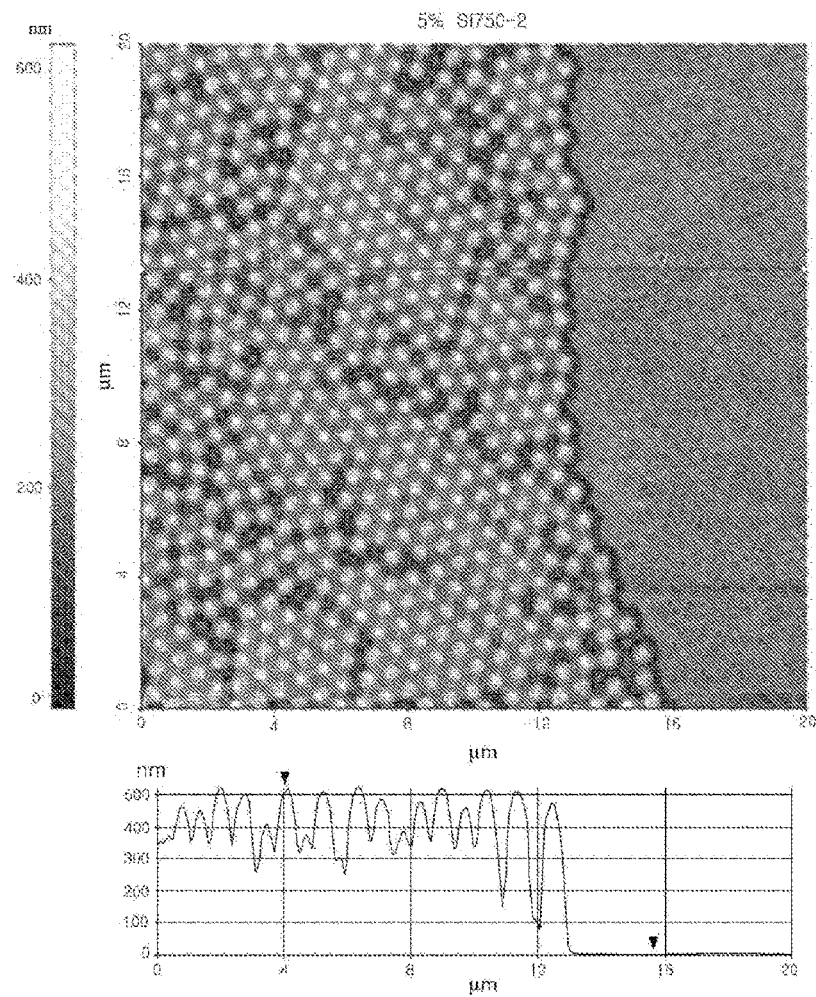
[Fig.15]
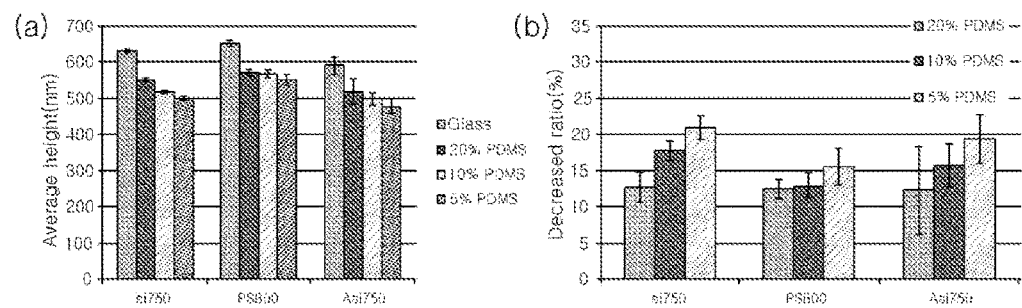

[Fig.16]
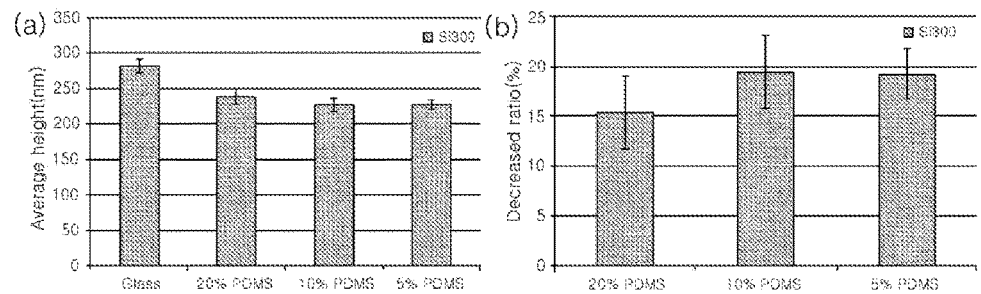
[Fig.17]
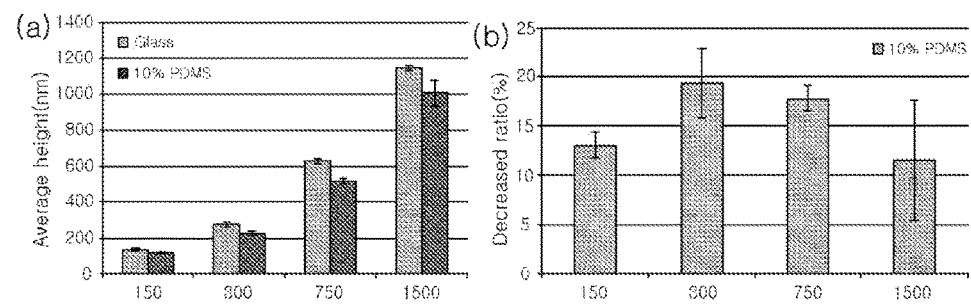
[Fig.18]
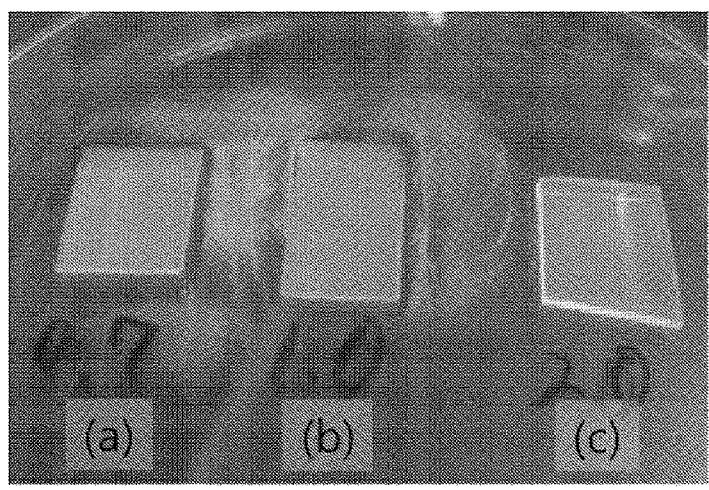

[Fig.19]
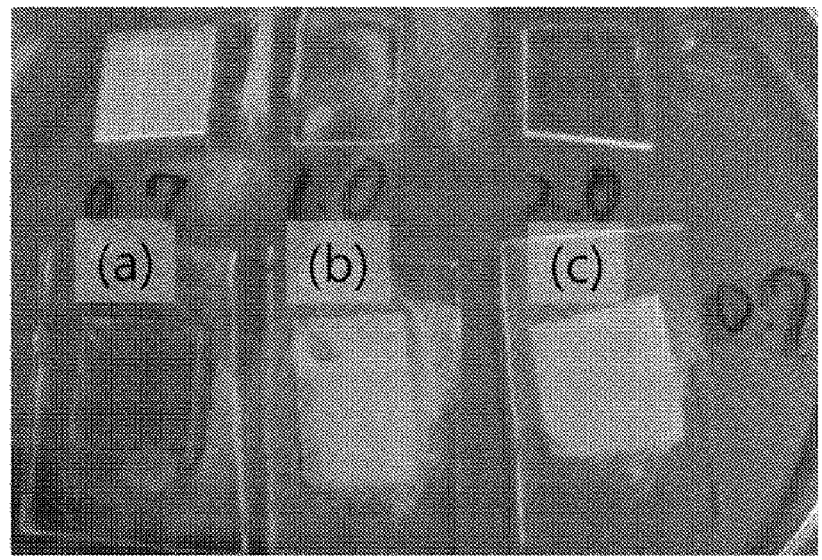
[Fig.20]
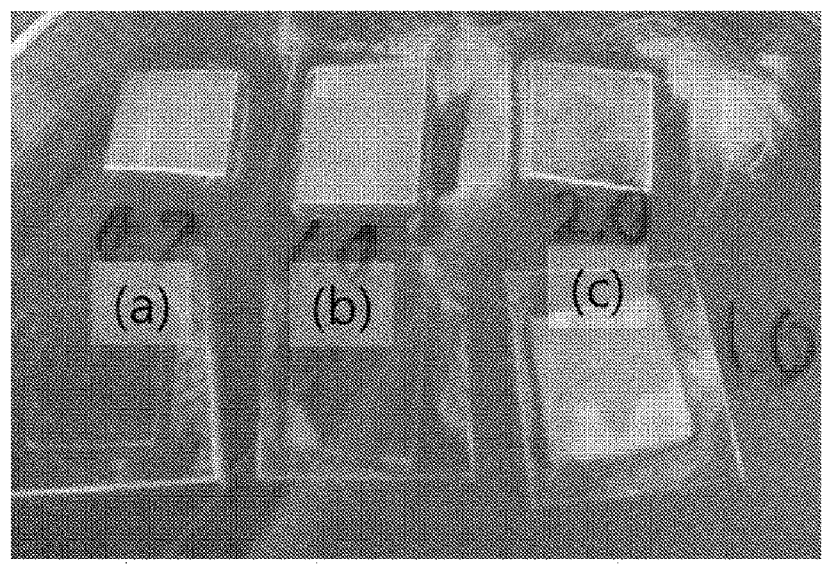

[Fig.21]
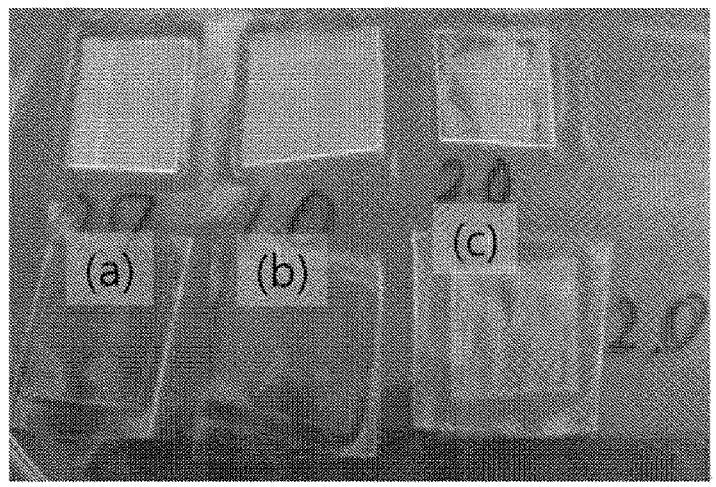
[Fig.22]
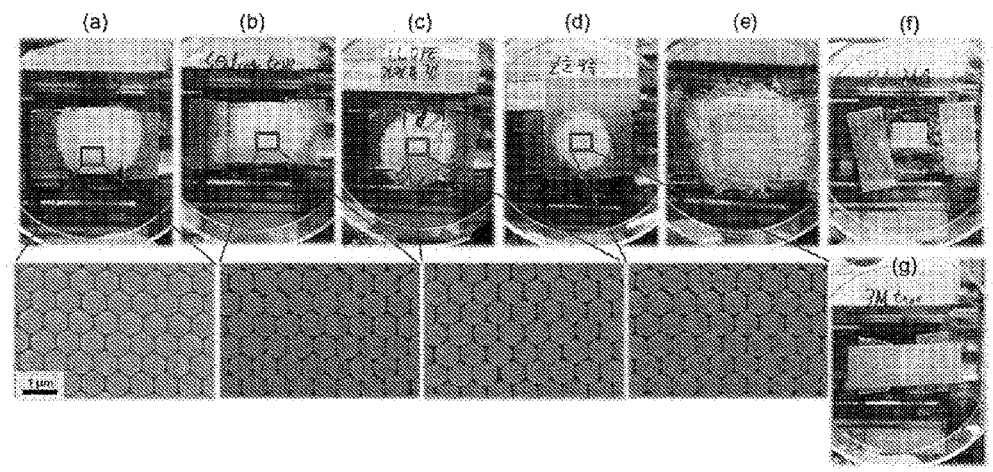

COATING METHOD USING PARTICLE ALIGNMENT AND PARTICLE COATED SUBSTRATE MANUFACTURED THEREBY

TECHNICAL FIELD

The present invention relates to a coating method using particle alignment and a particle coated substrate manufactured thereby, and, more particularly, to a coating method using particle alignment, which enables a plurality of particles to be provided in the form of a monolayer having a high density, and to a particle coated substrate manufactured thereby.

BACKGROUND ART

Coating techniques which are performed in such a manner that nanometer- or micrometer-sized particles are aligned on a substrate so as to coat the substrate therewith, are required in a variety of fields. For example, such coating techniques may be applied to memory devices, linear and nonlinear optical devices, photoelectric devices, photomasks, deposition masks, chemical sensors, biochemical sensors, medical molecule detectors, dye-sensitized solar batteries, thin film solar batteries, cell incubators, surfaces of implants, etc.

A Langmuir-Blodgett (LB) method (hereinafter referred to as "LB method") is well known as one such technique for coating a substrate with aligned particles. In the LB method, a solution comprising particles dispersed in a solvent floats on the surface of water and is then pressed using a physical process, thus forming a thin film. A technique using such an LB method is disclosed in Korean Unexamined Patent Publication No. 10-2006-2146.

In the LB method, however, temperature, humidity, etc., should be precisely adjusted so that the particles are self-assembled in the solvent. Further, surface properties (e.g. hydrophobicity, charge properties, surface roughness), etc. of the particles on the substrate may have an influence on the movement of the particles. Accordingly, the particles may agglomerate, and thus may not be uniformly applied on the substrate. Specifically, a large region of the substrate may not be coated with the particles, and grain boundaries may be formed at positions where the agglomerating particles come into contact with each other, resulting in many defects.

DISCLOSURE

Technical Problem

Therefore, the present invention is intended to provide a coating method using particle alignment, wherein particles may be uniformly applied on a substrate using a simple process, and a particle coated substrate manufactured using the coating method.

Technical Solution

An embodiment of the present invention provides a coating method using particle alignment, comprising preparing a cohesive polymer substrate; and placing a plurality of particles on the cohesive polymer substrate and pressing the particles to the cohesive polymer substrate so that the cohesive polymer substrate is coated with the particles while forming recesses respectively corresponding to the particles on the cohesive polymer substrate.

Another embodiment of the present invention provides a particle coated substrate, comprising a cohesive polymer substrate; reversible recesses formed by elastic force of the substrate; and particles respectively positioned in the recesses and aligned on the substrate.

Advantageous Effects

According to the present invention, a coating method using particle alignment enables a coating layer to be formed by pressing dry particles on a cohesive polymer substrate without the use of a solvent or an attachment aid.

When the particles are brought into contact with the cohesive polymer substrate, the surface of the cohesive polymer substrate having flexibility is transformed so as to partially enclose the particles by virtue of surface tension. Accordingly, recesses corresponding to the particles are formed on the surface of the cohesive polymer substrate, thus improving binding properties. The reversible transformation of the surface of the cohesive polymer substrate facilitates the two-dimensional movement of the particles in contact with the substrate, so that the particles are easily re-distributed.

When the cohesion of the particles is enhanced by such surface transformation in this way, dependency on the surface properties of particles and the kind of polymer substrate can decrease, whereby the particles having various surface properties can be provided in the form of a monolayer. Upon forming the coating layer, there is no need to precisely adjust conditions such as temperature, humidity, concentration of particles and so on, the adjustment of which is required for self-assembly and spin coating, and particles having various surface properties can be easily applied under wide conditions. The particles can be uniformly applied in the form of a monolayer having a high density even when the particles are electrically charged, are a material able to easily form hydrogen bonding, are not electrically charged (close to a neutral charge), or are hydrophobic.

Therefore, according to the present invention, the particles can be uniformly distributed on the cohesive polymer substrate using a simple process, thus forming a monolayer having a high density.

DESCRIPTION OF DRAWINGS

The above and other objects, features and advantages of the present invention will be more clearly understood from the following detailed description taken in conjunction with the accompanying drawings, in which:

FIGS. 1A to 1C are cross-sectional views illustrating a coating process using particle alignment according to an embodiment of the present invention;

FIGS. 2A and 2B are cross-sectional views illustrating the cohesive polymer substrate after removal of the coating layer formed by the coating process using particle alignment according to the embodiment of the present invention;

FIGS. 3A to 3F are scanning electron microscope (SEM) images illustrating coating layers formed using $SiO_2$ particles having different average particle sizes of 160 nm, 330 nm, 740 nm, 1480 nm, 3020 nm and 5590 nm in Test Example 1 according to the present invention;

FIGS. 4A and 4B are SEM images illustrating coating layers formed using polystyrene particles having different average particle sizes of 800 nm and 2010 nm in Test Example 2 according to the present invention;

FIGS. 5A to 5D are SEM images illustrating a cohesive polymer substrate, an $SiO_2$ coating layer, an $Ag_3PO_4$ coating layer, and a $TiO_2$ coating layer in Test Example 3 according to the present invention;

FIGS. 6A to 6D are photographs illustrating the cohesive polymer substrate, the cohesive polymer substrate having the $SiO_2$ coating layer, the cohesive polymer substrate having the $Ag_3PO_4$ coating layer, and the cohesive polymer substrate having the $TiO_2$ coating layer, which are placed on the printed characters, in Test Example 3 according to the present invention;

FIGS. 7A to 7C are confocal laser scanning microscope (CLSM) images at magnifications of 1000× and 6000×, illustrating the $SiO_2$ coating layers formed on a glass substrate, a polystyrene substrate and a cohesive polymer substrate in Test Example 4 according to the present invention;

FIGS. 8A to 8C are CLSM images illustrating the particle detached portions and the coating layer formed using re-coating in Test Example 5 according to the present invention;

FIGS. 9A and 9B are CLSM and SEM images of the illustrative and comparative second $SiO_2$ coating films in Test Example 6 according to the present invention;

FIG. 10 is an atomic force microscope (AFM) image illustrating the region of the $SiO_2$ coating layer from which particles were removed, in Test Example 7 according to the present invention;

FIG. 11 is a photograph illustrating the $SiO_2$ coating layer formed on a Petri dish substrate having a diameter of 15 cm in Test Example 8 according to the present invention;

FIGS. 12A to 12C are SEM images illustrating the front sides of coating layers formed in Test Example 9 according to the present invention;

FIGS. 13A to 13C are SEM images illustrating the lateral sides of the coating layers formed in Test Example 9 according to the present invention;

FIG. 14 illustrates an AFM image of the coating layer from which the particles were partially detached using adhesive tape, and the line profile of the coating layer, in Test Example 9 according to the present invention;

FIGS. 15A and 15B are graphs illustrating the average particle height and the decreased ratio of the $SiO_2$ coating layer or PS coating layer and the amine (+charge) $SiO_2$ coating layer formed on a glass substrate, a 5% PDMS substrate, a 10% PDMS substrate, and a 20% PDMS substrate in Test Example 9 according to the present invention;

FIGS. 16A and 16B are graphs illustrating the average particle height and the decreased ratio of the coating layers formed using $SiO_2$ particles having an average particle size of 300 nm on the glass substrate, the 5% PDMS substrate, the 10% PDMS substrate, and the 20% PDMS substrate in Test Example 9 according to the present invention;

FIGS. 17A and 17B are graphs illustrating the average particle height and the decreased ratio of the coating layers formed using particles having average particle sizes of 150 nm, 300 nm, 750 nm and 1500 nm in Test Example 9 according to the present invention;

FIGS. 18A to 18C are photographs illustrating the $SiO_2$ coating layers formed on 7, 10 and 20% PDMS substrates in Test Example 10 according to the present invention;

FIGS. 19A to 19C are photographs illustrating the $SiO_2$ coating layers transferred to the first substrates (which are PDMS substrates having 7 parts by weight of a curing agent) in Test Example 10 according to the present invention;

FIGS. 20A to 20C are photographs illustrating the $SiO_2$ coating layers transferred to the second substrates (which are PDMS substrates having 10 parts by weight of a curing agent) in Test Example 10 according to the present invention;

FIGS. 21A to 21C are photographs illustrating the $SiO_2$ coating layers transferred to the third substrates (which are PDMS substrates having 20 parts by weight of a curing agent) in Test Example 10 according to the present invention; and FIGS. 22A to 22G are photographs illustrating the $SiO_2$ coating layers formed on a variety of cohesive polymer substrates and comparative substrates in Test Example 11 according to the present invention.

MODE FOR INVENTION

Hereinafter, a detailed description will be given of embodiments of the present invention with reference to the appended drawings, but the present invention is not limited to such embodiments and may be variously modified.

For the sake of clear and simple description, the parts unrelated to the description are omitted in the drawings. Wherever possible, the same reference numerals will be used throughout the drawings and the description to refer to the same or like parts. Furthermore, in order to achieve obvious description in the drawings, thickness, area, etc., are depicted to be large or small, and thickness, area, etc., of the present invention are not limited to the depiction of the drawings.

In this description, when any part "includes" another part, a further part is not excluded but may be additionally included, unless otherwise stated. Also, in layers, films, regions, plates, etc., when any part is positioned "on" another part, not only the case where any part is "directly on" another part but also the case where a further part is interposed between any part and another part are included. In layers, films, regions, plates, etc., when any part is "directly on" another part, there is no further part therebetween.

Below is a description of a coating method using particle alignment according to embodiments of the present invention with reference to the appended drawings.

FIGS. 1A to 1C are cross-sectional views illustrating a coating process using particle alignment according to an embodiment of the present invention.

As illustrated in FIG. 1A, a cohesive polymer substrate having a smooth surface 10a is prepared at ST10. Specifically, the surface of the cohesive polymer substrate 10 has neither a predetermined pattern nor bending, and may have surface roughness and structure to the extent of not limiting the movement of particles 20 (FIG. 1B) which form a coating layer 22 (FIG. 1C) thereon.

In this embodiment, the cohesive polymer substrate 10 includes a variety of cohesive polymer materials having cohesion. A cohesive polymer does not have adhesion which is typical, and is thus different from an adhesive. At least the cohesive polymer has a cohesion lower than about 0.6 kg/inch which is the adhesion of the 'Scotch® Magic™ Tape' adhesive (ASTM D 3330). Also, the cohesive polymer enables the shape of a solid (a substrate or film) to be maintained at room temperature even without an additional support. The cohesive polymer material may include a silicon-based polymer material such as polydimethylsiloxane (PDMS), etc., wraps including polyethylene (PE), polyvinylchloride (PVC), etc., and protective films including polymer materials for use in cohering or sealing. Particularly useful as the cohesive polymer is PDMS, which is easy to adjust hardness and may be easily provided in various forms. The polymer substrate 10 may be prepared by coating a base substrate with a cohesive polymer or by attaching a sheet or film type of cohesive polymer to a base substrate.

The cohesive polymer material indicates an organic polymer material, which typically includes silicon in a solid phase or is imparted with cohesion by addition of a plasticizer or via surface treatment. The cohesive polymer material is easily transformed by virtue of a linear molecular structure and has low surface tension. Superior cohesion of the cohesive polymer material is based on a soft (flexible) surface material, which facilitates surface transformation at small regions, and on low surface tension. The low surface tension of the cohesive polymer material enables the cohesive polymer material to be widely attached to the particles 20 (similar to wetting of a solution), and the flexible surface thereof makes it possible to come into close contact with the particles 20 to be attached. Thereby, the cohesive polymer may be reversibly removably attached to the surface of a solid without complementary binding force. The surface tension of a silicon-based polymer material such as PDMS as the representative cohesive polymer material is about 20~23 dynes/cm, which is approximately close to that of Teflon (18 dynes/cm) known as a material having the lowest surface tension. The surface tension of a silicon-based polymer material such as PDMS is lower than those of most of organic polymers (35~50 dynes/cm), natural cotton (73 dynes/cm), metal (e.g. silver (Ag) has a surface tension of 890 dynes/cm, and aluminum (Al) has a surface tension of 500 dynes/cm), and inorganic oxide (e.g. glass has a surface tension of 1000 dynes/cm, and iron oxide has a surface tension of 1357 dynes/cm). Further, in the case of wraps including PE, PVC and so on, low surface tension is exhibited due to the addition of a large amount of plasticizer to increase cohesion.

Subsequently, as illustrated in FIGS. 1B and 1C, particles 20 are aligned on the cohesive polymer substrate 10 to form a coating layer 22 at ST12, which is specified below.

As illustrated in FIG. 1B, dry particles 20 are placed on the cohesive polymer substrate 10. Unlike this embodiment, particles dispersed in a solution are difficult to come into direct contact with the surface of the cohesive polymer, making it difficult to efficiently perform a coating process. Thus, the particles may be dried during coating only when using a solution or volatile solvent in an amount smaller than that of mass of the particles used, so that the coating process may be conducted.

In this embodiment, the particles 20 may include a variety of materials to form a coating layer 22 (FIG. 1C). Specifically, the particles 20 may include a polymer, an inorganic material, a metal, a magnetic material, a semiconductor, a biomaterial, etc. Further, a mixture of particles having different properties may be used to form the coating layer.

Examples of the polymer may include polystyrene (PS), polymethylmethacrylate (PMMA), polyacrylate, polyvinylchloride (PVC), polyalphastyrene, polybenzylmethacrylate, polyphenylmethacrylate, polydiphenylmethacrylate, polycyclohexylmethacrylate, a styrene-acrylonitrile copolymer, a styrene-methylmethacrylate copolymer, etc.

Examples of the inorganic material may include silicon oxide (e.g. $SiO_2$), silver phosphate (e.g. $Ag_3PO_4$), titanium oxide (e.g. $TiO_2$), iron oxide (e.g. $Fe_2O_3$), zinc oxide, cerium oxide, tin oxide, thallium oxide, barium oxide, aluminum oxide, yttrium oxide, zirconium oxide, copper oxide, nickel oxide, etc.

Examples of the metal may include gold, silver, copper, iron, platinum, aluminum, zinc, cerium, thallium, barium, yttrium, zirconium, tin, titanium, or alloys thereof.

Examples of the semiconductor may include silicon, germanium, or compound semiconductors (e.g. AlP, AlAs, AlSb, GaN, GaP, GaAs, InP, InAs, InSb, etc.).

Examples of the biomaterial may include proteins, peptides, ribonucleic acid (RNA), deoxyribonucleic acid (DNA), polysaccharides, oligosaccharides, lipids, cells or composites thereof, which constitutes the particles, is applied on the surface of the particles, or is incorporated in the particles. For example, useful are polymer particles coated with an antibody binding protein such as protein A.

The particles 20 may have a symmetrical shape, an asymmetrical shape, an amorphous shape, or a porous shape. For example, the particles 20 may have a spherical shape, an oval spherical shape, a hemispherical shape, a cubic shape, a tetrahedral shape, a pentahedral shape, a hexahedral shape, an octahedral shape, a cylindrical shape, a conical shape, etc. As such, the particles 20 preferably have a spherical shape or an oval spherical shape.

The particles 20 may have an average particle size ranging from 10 nm to 50 μm. If the average particle size thereof is less than 10 nm, these particles may be thoroughly enclosed by the cohesive polymer substrate 10, making it difficult to apply the particles 20 in the form of a monolayer coating layer. Also, if the average particle size thereof is less than 10 nm, the particles may agglomerate even in a dry state, making it difficult to individually move the particles by only the rubbing force. In contrast, if the average particle size thereof exceeds 50 μm, attachment of the particles may become weak. The average particle size thereof is preferably set to 50 nm~10 μm. However, the present invention is not limited thereto, and the average particle size thereof may vary depending on the components of the particles, the components of the cohesive polymer substrate 10, etc. In the case where the particles 20 have a spherical shape, the diameter of the particles 20 may be used as the particle size. In the case where the shape of the particles 20 is not spherical, a variety of measurement methods may be utilized, and for example, the average value between the long-axis value and the short-axis value of the particles may be used as the particle size.

Subsequently, as illustrated in FIG. 1C, the particles 20 are pressed to the cohesive polymer substrate to form the coating layer 22. The pressing process may be performed via rubbing using latex, sponge, hand, a rubber plate, a plastic plate, a material having a smooth surface, etc. However, the present invention is not limited thereto, and the particles 20 may be pressed using various methods.

In this embodiment, when the particles 20 placed on the plane 10a of the cohesive polymer substrate 10 are pressed to the cohesive polymer substrate, the particles 20 at positions which are pressed cohere via transformation of the cohesive polymer substrate 10. Thereby, recesses 12 corresponding to the particles 20 are formed at the pressed positions on the substrate. Thus, the particles 20 which are enclosed by the recesses 12 are aligned on the cohesive polymer substrate 10. The recesses 12 are reversibly formed via interaction between the particles and the substrate. Briefly, the recesses may disappear, or the positions thereof may be changed. For example, when the particles are moved in the course of rubbing, the recesses 12 may disappear due to the elastic restoring force of the substrate, or the positions of the recesses 12 may vary depending on the movement of the particles. The particles may be uniformly aligned by virtue of such a reversible action (the term "reversible" is a property generated by flexibility and elastic restoring force of the surface of the cohesive polymer substrate upon coating, and is a broad meaning including the case where the cohesive polymer substrate is not reversible any more as the restoring force thereof becomes weak or is lost over time). The particles 20 which do not cohere to the substrate are moved to the portion of the cohesive polymer substrate 10, which is not coated with the particles 20, by means of the rubbing force, and the recesses 12 are formed by the particles 20 at the non-coated portion of the substrate, and the particles 20 enclosed with the recesses 12 cohere to the cohesive polymer substrate 10. Through these procedures, the particles are provided in the form of a monolayer coating layer 22 having a high density on the cohesive polymer substrate 10.

The recesses 12 may have a shape complementary to the shape of the particles 20 so as to partially enclose the particles 20. For example, when the particles 20 may have a spherical shape, the recesses 12 may also have a round shape, so that the recesses 12 may come into partial contact with the particles 20. The depth (L1) of the recesses 12 may vary depending on the hardness of the cohesive polymer substrate 10, the shape and hardness of the particles 20, environmental factors (e.g. temperature), etc. Specifically, as the hardness of the cohesive polymer substrate 10 becomes larger, the depth (L1) of the recesses 12 may decrease, and as the temperature is higher, the depth (L1) of the recesses 12 may increase.

As such, the ratio (decreased ratio; L1/D) of the depth (L1) of the recesses 12 relative to the average particle size (D) of the particles 20 may be 0.02~0.7. If the ratio (L1/D) is less than 0.02, the binding force between the particles 20 and the cohesive polymer substrate 10 may become insufficient. In contrast, if the ratio is higher than 0.7, it is difficult to apply the particles 20 in the form of a monolayer. Taking into consideration the binding force and coating properties, the ratio (L1/D) may be set to 0.05~0.6, and preferably 0.08~0.4.

In this embodiment, when the particles 20 are partially enclosed by the recesses 12 formed via elastic transformation, the particles 20 may more efficiently cohere to the cohesive polymer substrate 10. The particles 20 which cohere to the cohesive polymer substrate 10 may be moved to the portion of the substrate which is not coated, so that new particles 20 may be attached to the empty space of the surface of the cohesive polymer substrate 10. This rearrangement enables the coating layer 22 to be a monolayer having a high density. For example, the particles 20 may be disposed such that the centers thereof may form a hexagonal shape. On the other hand, in the case where the shape of the particles 20 is not spherical (e.g. $Ag_3PO_4$), whether the coating layer is a monolayer may be checked using a variety of methods. For example, the case where the ratio of the average thickness of the coating layer 22 relative to the average particle size of particles 20 (i.e. large particles 20 within the top 10% by size) corresponding to the top 10% by size among the particles 20 is 1.9 or less is regarded as the monolayer.

In this embodiment, the dry particles 20, which are in direct contact with the surface of the cohesive polymer substrate 10, without the use of a solvent, are pressed to the cohesive polymer substrate, thereby forming the coating layer 22. Accordingly, upon forming the coating layer 22, self-assembly of the particles 20 in the solvent is not required, and thus temperature, humidity, etc., need not be precisely adjusted, and the surface properties of the particles 20 are not greatly affected. That is, even when the particles 20 are a non-charged material (close to the neutral charge), in addition to a charged material, these particles may be uniformly applied at a high density. Also, not only hydrophilic particles but also hydrophobic particles may be uniformly applied. According to the present embodiment, the particles are uniformly distributed on the cohesive polymer substrate 10 using a simple process, thereby forming the monolayer having a high density.

Such a coating layer 22 may be used in the form of cohering to the cohesive polymer substrate 10, or may be used in the form of being transferred to another substrate, etc. As such, when another substrate to which the coating layer 22 is transferred has cohesion or adhesion greater than that of the cohesive polymer substrate 10, the entire coating layer 22 may be uniformly efficiently transferred.

In this embodiment, because the recesses 12 are formed on the cohesive polymer substrate 10 due to the elastic transformation, when the coating layer 22 is subsequently removed, as illustrated in FIG. 2A, the recesses 12 of the cohesive polymer substrate 10 disappear, and the surface of the substrate is restored to the smooth surface 10a. However, in the case where the coating layer 22 which has been formed is removed after a while, as illustrated in FIG. 2B, marks having the shape of the recesses 12 may be left behind on the surface of the cohesive polymer substrate 10.

A better understanding of the present invention may be obtained through the following test examples which are set forth to illustrate, but are not to be construed as limiting the present invention.

Test Example 1

A cohesive polymer substrate, comprising PDMS and 10 parts by weight of a curing agent based on Sylgard 184 (available from Dow Corning, USA), was prepared.

$SiO_2$ particles were placed on the cohesive polymer substrate, and then rubbed while being manually pressed using a sponge covered with a latex film to form recesses on the surface of the cohesive polymer substrate, so that the $SiO_2$ particles cohered to the cohesive polymer substrate, thus forming a $SiO_2$ coating layer.

The SEM images of the coating layers formed using the $SiO_2$ particles having different average particle sizes of 160 nm, 330 nm, 740 nm, 1480 nm, 3020 nm, and 5590 nm are illustrated in FIGS. 3A, 3B, 3C, 3D, 3E, and 3F, respectively. With reference to FIGS. 3A to 3F, the $SiO_2$ particles were disposed such that the centers thereof were arranged in a hexagonal form to have a high density. According to the present invention, the particles can be seen to be uniformly applied in the form of a monolayer having a high density.

Test Example 2

A cohesive polymer substrate, comprising PDMS and 10 parts by weight of a curing agent based on Sylgard 184, was prepared.

Polystyrene particles were placed on the cohesive polymer substrate, and then rubbed while being manually pressed using a sponge covered with a latex film to form recesses on the surface of the cohesive polymer substrate, so that the polystyrene particles cohered to the cohesive polymer substrate, thus forming a polystyrene coating layer.

The SEM images of the coating layers formed using the polystyrene particles having different average particle sizes of 800 nm and 2010 nm are illustrated in FIGS. 4A and 4B, respectively. With reference to FIGS. 4A and 4B, the polystyrene particles were disposed such that the centers thereof were arranged in a hexagonal form to have a high density. According to the present invention, the non-charged particles can be seen to be uniformly applied at a high density.

Test Example 3

Cohesive polymer substrates, each comprising PDMS and 10 parts by weight of a curing agent based on Sylgard 184, were prepared.

SiO$_2$ particles having an average particle size of 750 nm were placed on the first cohesive polymer substrate, and then rubbed while being manually pressed using a sponge covered with a latex film to form recesses on the surface of the first cohesive polymer substrate, so that the SiO$_2$ particles cohered to the cohesive polymer substrate, thus forming a SiO$_2$ coating layer.

Ag$_3$PO$_4$ particles were placed on the second cohesive polymer substrate, and then rubbed while being manually pressed using a sponge covered with a latex film to form recesses on the surface of the second cohesive polymer substrate, so that the Ag$_3$PO$_4$ particles cohered to the cohesive polymer substrate, thus forming an Ag$_3$PO$_4$ coating layer.

TiO$_2$ particles having an average particle size of 40 nm were placed on the third cohesive polymer substrate, and then rubbed while being manually pressed using a sponge covered with a latex film to form recesses on the surface of the third cohesive polymer substrate, so that the TiO$_2$ particles cohered to the cohesive polymer substrate, thus forming a TiO$_2$ coating layer. As such, the TiO$_2$ particles exhibited strong attraction therebetween due to the small diameter, and were provided in the form of a multilayer structure via rubbing pressure and washing with ethanol and distilled water.

The SEM images of the non-coated cohesive polymer substrate, the SiO$_2$ coating layer, the Ag$_3$PO$_4$ coating layer, and the TiO$_2$ coating layer are shown in FIGS. 5A, 5B, 5C and 5D, respectively. With reference to FIGS. 5B to 5D, respective coating layers can be seen to be uniformly distributed.

The cohesive polymer substrate, the cohesive polymer substrate having the SiO$_2$ coating layer, the cohesive polymer substrate having the Ag$_3$PO$_4$ coating layer, and cohesive polymer substrate having the TiO$_2$ coating layer were placed on the printed characters. The photographs thereof are shown in FIGS. 6A, 6B, 6C and 6D, respectively. With reference to FIGS. 6B to 6D, respective coating layers had high transparency. That is, the coating layers were applied to the level of a monolayer.

Test Example 4

In order to evaluate a difference in particle coating properties between the cohesive polymer substrate and the other substrates, the following test was performed. Specifically, a washed general glass substrate, a polystyrene (PS) substrate and a cohesive polymer substrate were prepared. This cohesive polymer substrate comprised PDMS and 10 parts by weight of a curing agent based on Sylgard 184. SiO$_2$ particles having an average particle size of 750 nm were placed on each substrate, and then rubbed while being manually pressed using a sponge covered with a latex film, thus forming SiO$_2$ coating layers.

The CLSM images at magnifications of 1000× and 6000×, showing the SiO$_2$ coating layers formed on the glass substrate, the PS substrate and the cohesive polymer substrate, are illustrated in FIGS. 7A, 7B and 7C.

As illustrated in FIGS. 7A and 7B, the glass substrate or the PS substrate was irregularly coated with the particles at a low density, whereas the particles were aligned in the form of a monolayer having a high density on the PDMS substrate as illustrated in FIG. 7C.

Test Example 5

In order to evaluate the reversible attachment of the particles to the cohesive polymer substrate, the following test was performed. Specifically, a cohesive polymer substrate comprising PDMS and 10 parts by weight of a curing agent based on Sylgard 184 was prepared. SiO$_2$ particles having an average particle size of 750 nm were placed on the cohesive polymer substrate, and then rubbed while being manually pressed using a sponge covered with a latex film to form recesses on the surface of the cohesive polymer substrate, so that the SiO$_2$ particles cohered to the cohesive polymer substrate, thus forming a SiO$_2$ coating layer.

A portion of the coating layer composed of particles was removed in such a manner that adhesive tape (3M Magic Tape, USA) was attached to and detached from the portion of the coating layer, as illustrated in FIGS. 8A and 8B. Thereafter, SiO$_2$ particles having an average particle size of 750 nm were placed again on the cohesive polymer substrate, and then rubbed while being manually pressed using a sponge covered with a latex film to form recesses on the surface of the cohesive polymer substrate, so that the SiO$_2$ particles cohered to the cohesive polymer substrate, thus forming a SiO$_2$ coating layer. Thus, as illustrated in FIG. 8C, the particles were aligned in the form of a monolayer having a high density on the portion of the coating layer from which the adhesive tape was detached.

Test Example 6

In order to evaluate a difference between the method of coating the cohesive polymer substrate with particles and the typical method using particle alignment via self-assembly, the following test was performed. Specifically, a cohesive polymer substrate comprising PDMS and 10 parts by weight of a curing agent based on Sylgard 184 was prepared. SiO$_2$ particles having an average particle size of 750 nm were placed on the cohesive polymer substrate, and then rubbed while being manually pressed using a sponge covered with a latex film to form recesses on the surface of the cohesive polymer substrate, so that the SiO$_2$ particles cohered to the cohesive polymer substrate, thus forming a first SiO$_2$ coating layer. A portion of the first SiO$_2$ coating layer was removed using adhesive tape, after which, without additionally placing the particles on the substrate, rubbing was performed while being manually pressed using a sponge covered with a latex film to form recesses on the surface of the cohesive polymer substrate, so that the SiO$_2$ particles cohered to the cohesive polymer substrate, thus forming a second SiO$_2$ coating layer.

The CLSM image of the second SiO$_2$ coating layer is illustrated in FIG. 9A. For comparison, the SEM image of the coating layer formed using a typical LB method is illustrated in FIG. 9B.

With reference to FIG. 9A, in the course of re-aligning the particles to form the second SiO$_2$ coating layer, the number of particles is not enough to form a full monolayer, and thus the particles are spaced apart from each other. With reference to FIG. 9B, however, the particles agglomerate when using the LB method, thus forming domains and large empty spaces. This is because the coating of the cohesive polymer substrate with the particles is achieved using the interaction between the surface of the substrate and the particles, in lieu of the attraction between the particles upon self-assembly, and also because the binding between the particles and the substrate is reversibly carried out on the plane, making it possible to freely move the particles on the plane.

Test Example 7

In order to evaluate transformation and restoring force (elasticity) of the cohesive polymer in the method of coating the cohesive polymer substrate with the particles, the following test was conducted. Specifically, a cohesive polymer substrate (a PDMS substrate) comprising PDMS and 10 parts by weight of a curing agent based on Sylgard 184 was prepared. $SiO_2$ particles having an average particle size of 750 nm were placed on the cohesive polymer substrate, and then rubbed while being manually pressed using a sponge covered with a latex film to form recesses on the surface of the cohesive polymer substrate, so that the $SiO_2$ particles cohered to the cohesive polymer substrate, thus forming a $SiO_2$ coating layer. The substrate having the $SiO_2$ coating layer was stored at room temperature for 3 days, after which a portion of the coating layer was removed using adhesive tape. The region of the coating layer having no particles was three-dimensionally observed using an atomic force microscope (AFM). The AFM image of the region of the $SiO_2$ coating layer having no particles is illustrated in FIG. 10.

As illustrated in FIG. 10, the recesses corresponding to the aligned particles were formed on the surface of the PDMS substrate. The maximum depth of the recesses was very low within 10 nm. Through additional measurement, upon coating the PDMS substrate with the particles, there was a height reduction of 110 nm (depth of impregnated particles). That is, the maximum depth of the recesses fell within 10% of the depth of impregnated particles. This is considered to be because the surface of the PDMS substrate was transformed due to the particles, but was restored to an original form by 90% or more.

Test Example 8

In order to evaluate whether the method of coating the cohesive polymer substrate with the particles may be performed on a large area, the test was conducted on a Petri dish having a diameter of 15 cm as follows. Specifically, a cohesive polymer substrate comprising PDMS and 10 parts by weight of a curing agent based on Sylgard 184 was provided on the dish. $SiO_2$ particles having an average particle size of 750 nm were placed on the cohesive polymer substrate, and then rubbed while being manually pressed using a sponge covered with a latex film to form recesses on the surface of the cohesive polymer substrate, so that the $SiO_2$ particles cohered to the cohesive polymer substrate, thus forming a $SiO_2$ coating layer. The photograph of the $SiO_2$ coating layer formed on the Petri dish substrate having a diameter of 15 cm is illustrated in FIG. 11.

With reference to FIG. 11, the entire dish having a diameter of 15 cm was uniformly coated with the particles of the $SiO_2$ coating layer and thus interference color (which is observed only on the thin film having a uniform structure) was observed.

Test Example 9

In order to evaluate the use of particles having a variety of surface properties in the method of coating the cohesive polymer substrate with particles, the following test was conducted. Specifically, cohesive polymer substrates (5% PDMS substrates) comprising PDMS and 5 parts by weight of a curing agent based on Sylgard 184 were prepared. First $SiO_2$ particles having an average particle size of 750 nm and being negatively charged, PS particles having an average particle size of 800 nm and being hydrophobic, and second $SiO_2$ particles (amine modified $SiO_2$) having an average particle size of 750 nm and being positively charged were placed on the respective cohesive polymer substrates, and then rubbed while being manually pressed using a sponge covered with a latex film to form recesses on the surfaces of the cohesive polymer substrates, so that the $SiO_2$ particles cohered to the cohesive polymer substrates, thus forming $SiO_2$ coating layers or a PS coating layer.

$SiO_2$ coating layers or a PS coating layer were formed in the same manner as above on cohesive polymer substrates (10% PDMS substrates) comprising PDMS and 10 parts by weight of a curing agent. Also, $SiO_2$ coating layers or a PS coating layer were formed in the same manner as above on cohesive polymer substrates (20% PDMS substrates) comprising PDMS and 20 parts by weight of a curing agent.

The SEM images of the front sides of the particles of the coating layers formed using the first $SiO_2$ particles, the PS particles and the second $SiO_2$ particles are illustrated in FIGS. 12A, 12B and 12C. As such, the uppermost line shows the coating layers formed on the 5% PDMS substrates, the middle line shows the coating layers formed on the 10% PDMS substrates and the lowermost line shows the coating layers formed on the 20% PDMS substrates.

The SEM images of the lateral sides of the particles of the coating layers formed using the first $SiO_2$ particles, the PS particles and the second $SiO_2$ particles are illustrated in FIGS. 13A, 13B and 13C. As such, the uppermost line shows the coating layers formed on the 5% PDMS substrates, the middle line shows the coating layers formed on the 10% PDMS substrates and the lowermost line shows the coating layers formed on the 20% PDMS substrates.

With reference to FIGS. 12A to 12C, the $SiO_2$ coating layer or the PS coating layer was configured such that the particles were aligned in the form of a monolayer thin film having a high density, regardless of the hardness of the PDMS substrate and the charge properties of the particles. With reference to FIGS. 13A to 13C, the $SiO_2$ coating layer and the PS coating layer had different decreased ratios depending on the hardness of the PDMS substrate. In the case of the PDMS substrate having 5 parts by weight of the curing agent and thus exhibiting low hardness and easy transformation, the decreased ratio of the particles was large, and the PDMS substrate was raised along the lower surfaces of the particles as in a capillary action. This phenomenon gradually diminished in the PDMS substrates which had high elasticity and were not easy to transform because of the use of the curing agent in an amount increased to 10 and 20 parts by weight. The raising of the PDMS substrate along the lower surfaces of the particles as in a capillary action is considered to be due to flexibility of the cohesive polymers at the small regions.

In order to quantify the extent of decrease of the particles varying depending on the hardness (elasticity) of the substrate, the particles of the coating layer were partially detached using adhesive tape. The AFM image thereof and the line profile of the coating layer are illustrated in FIG. 14. In the $SiO_2$ coating layer or the PS coating layer formed on the glass substrate, the 5% PDMS substrate, the 10% PDMS substrate and the 20% PDMS substrate, the average particle height and the decreased ratio were measured using AFM. The results are illustrated in FIGS. 15A and 15B. With reference to FIGS. 15A and 15B, the particles having different surface properties (charge, polarity) commonly exhibited lower particle height on the PDMS substrate than on the glass substrate having no surface transformation. The decreased ratio was about 12% on the 20% PDMS substrate having high hardness, and was increased in proportion to a reduction in hardness of the substrate. The effects of the surface properties of the particles are considered to be smaller, compared to the difference in hardness of the substrate.

In addition, SiO$_2$ particles having an average particle size of 300 nm were applied in the same manner as above. The results are illustrated in FIGS. 16A and 16B. Also in this case, the height was lower on the PDMS substrate than on the glass substrate. The decreased ratio was about 15% on the 20% PDMS substrate having high hardness, and was increased in proportion to a reduction in hardness.

In order to evaluate the effects of the particle size, coating layers were formed using particles having average particle sizes of 150 nm and 1500 nm on the 10% PDMS substrate. In the coating layers formed using particles having average particle sizes of 150 nm, 300 nm, 750 nm and 1500 nm, the average particle height and the decreased ratio are illustrated in FIGS. 17A and 17B, respectively. With reference to FIGS. 17A and 17B, the results were similar to those of FIGS. 15A, 15B, 16A and 16B. The specific results due to the particle size were not observed, and the decreased ratio relative to the particle size was about 10~20%.

Test Example 10

SiO$_2$ particles having an average particle size of 750 nm were placed on cohesive polymer substrates (7% PDMS substrate, 10% PDMS substrate, 20% PDMS substrate) comprising PDMS and a curing agent in amounts of 7, 10 and 20 parts by weight based on Sylgard 184, and then rubbed while being manually pressed using a sponge covered with a latex film to form recesses on the surfaces of the cohesive polymer substrates, so that the SiO$_2$ particles cohered to the cohesive polymer substrates, thus forming SiO$_2$ coating layers. The photographs thereof are illustrated in FIGS. 18A, 18B and 18C. FIG. 18A shows the SiO$_2$ coating layer formed on the 7% PDMS substrate (represented by 0.7), FIG. 18B shows the SiO$_2$ coating layer formed on the 10% PDMS substrate (represented by 1.0), and FIG. 18C shows the SiO$_2$ coating layer formed on the 20% PDMS substrate (represented by 2.0). These are also the same in the following FIGS. 19A to 19C, 20A to 20C and 21A to 21C.

The SiO$_2$ coating layers formed on the cohesive polymer substrates as above were transferred to the first substrates (which are PDMS substrates including 7 parts by weight of a curing agent). The photographs thereof are illustrated in FIGS. 19A, 19B and 19C.

The SiO$_2$ coating layers formed on the cohesive polymer substrates as above were transferred to the second substrates (which are PDMS substrates including 10 parts by weight of a curing agent). The photographs thereof are illustrated in FIGS. 20A, 20B and 20C.

The SiO$_2$ coating layers formed on the cohesive polymer substrates as above were transferred to the third substrates (which are PDMS substrates including 20 parts by weight of a curing agent). The photographs thereof are illustrated in FIGS. 21A, 21B and 21C.

With reference to FIGS. 19A to 19C, FIG. 19A shows that the SiO$_2$ coating layer formed on the 7% PDMS substrate was not efficiently transferred to the first substrate, and FIGS. 19B and 19C show that the SiO$_2$ coating layers formed on the 10% and 20% PDMS substrates were efficiently transferred to the first substrates. With reference to FIGS. 20A to 20C, FIGS. 20A and 20B show that the SiO$_2$ coating layers formed on the 7% and 10% PDMS substrates were not efficiently transferred to the second substrates, and FIG. 20C shows that the SiO$_2$ coating layer formed on the 20% PDMS substrate was efficiently transferred to the second substrate. With reference to FIGS. 21A to 21C, FIGS. 21A to 21C show that the SiO$_2$ coating layers formed on the 7%, 10% and 20% PDMS substrates were not efficiently transferred to the third substrates.

That is, most of the particles of the SiO$_2$ coating layer formed on the cohesive polymer substrate were transferred to the new substrate having lower hardness (higher flexibility) than the cohesive polymer substrate. This phenomenon is because the attachment between the particles and the substrate is based on flexibility (elasticity), and also manifests the extent of binding between the particles and the substrate. Further, the particles can be seen to be easily transferred to the substrate having high flexibility (low hardness) and thus high cohesion. Ultimately, the coating layer according to the present invention may be transferred to another substrate, and may thus be utilized in a variety of applications.

Test Example 11

In order to evaluate whether various cohesive polymer substrates may be coated with particles, the following test was conducted. As cohesive polymer substrates, a PDMS substrate including 10 parts by weight of a curing agent based on Sylgard 184, a silicon-based sealing tape for laboratories, a linear low-density polyethylene (LLDPE) wrap for home, a substrate gloss protecting film, and a polyvinylchloride (PVC) wrap were prepared. As comparative substrates, a polymethylmethacrylate (PMMA) substrate having no cohesion and 3M Magic Tape were prepared. On each of the cohesive polymer substrates and the comparative substrates such as PMMA substrate and 3M Magic Tape, SiO$_2$ particles having an average particle size of 750 nm were placed, and then rubbed while being manually pressed using a sponge covered with a latex film to form recesses on the surfaces of the substrates, so that the SiO$_2$ particles cohered to the substrates, thus forming SiO$_2$ coating layers.

FIG. 22A shows the SiO$_2$ coating layer formed on the PDMS substrate, FIG. 22B shows the SiO$_2$ coating layer formed on the silicon-based sealing tape for laboratories, FIG. 22C shows the SiO$_2$ coating layer formed on the LLDPE wrap, FIG. 22D shows the SiO$_2$ coating layer formed on the substrate gloss protecting film, and FIG. 22E shows the SiO$_2$ coating layer formed on the PVC wrap. Further, FIG. 22F shows the SiO$_2$ coating layer formed on the PMMA substrate, and FIG. 22G shows the SiO$_2$ coating layer formed on the 3M Magic Tape.

With reference to FIGS. 22A to 22E, the cohesive polymer substrates exhibited light interference thanks to uniform coating of particles, but the comparative substrates manifested turbid white color as illustrated in FIGS. 22F and 22G.

According to the present invention, without additional use of an attachment aid layer, a solvent, etc., dry particles can be brought into direct contact with the surface of the cohesive polymer substrate and can thus cohere thereto, thus improving binding properties.

The aforementioned features, structures, effects, etc., are incorporated into at least one embodiment of the present invention, and are not necessarily limited to only one embodiment. Further, features, structures, effects, etc., illustrated in respective embodiments may be combined or modified in other embodiments by those skilled in the art. Accordingly, such modifications and variations should also be understood as falling within the claims of the present invention.

The invention claimed is:

1. A particle coated substrate, comprising:
a cohesive polymer substrate;
reversible recesses formed on the substrate; and
particles respectively positioned in the recesses and aligned on the substrate to form a coating layer,
wherein the particles are applied in a monolayer form,
wherein the reversible recesses are formed when the particles are placed on the cohesive polymer substrate and pressed,
wherein the reversible recesses are formed via interaction between the particles and the substrate, and have a shape corresponding to the shape of the particles,
wherein the cohesive polymer substrate includes a plurality of raised portions from a top surface of the substrate, each of the plurality of raised portions surrounding and directly contacting a lower surface of a corresponding one of the particles, and
wherein a ratio of a depth of the recesses to an average particle size of the particles is 0.02~0.7.

2. The particle coated substrate of claim 1, wherein the cohesive polymer substrate includes any one selected from among a silicon-based polymer material, a wrap, and a surface protecting film.

3. The particle coated substrate of claim 2, wherein the cohesive polymer substrate includes polydimethylsiloxane (PDMS), or the wrap including at least one selected from among polyethylene (PE) and polyvinylchloride (PVC).

4. The particle coated substrate of claim 1, wherein, when the particles have a non-spherical shape, a ratio of an average thickness of the coating layer relative to an average particle size of particles corresponding to the top 10% by size among the particles is 1.9 or less.

5. The particle coated substrate of claim 1, wherein the particles have an average particle size ranging from 10 nm to 50 μm.

6. The particle coated substrate of claim 1, wherein the particles have a spherical shape or an oval spherical shape.

7. The particle coated substrate of claim 1, wherein the particles include a charged material.

8. The particle coated substrate of claim 1, wherein the particles include a non-charged material.

9. The particle coated substrate of claim 1, wherein the particles include a hydrophobic material.

10. The particle coated substrate of claim 1, wherein the particles include a mixture of particles having different properties.

11. The particle coated substrate of claim 1, wherein the cohesive polymer substrate has a surface tension sufficiently low to form a meniscus on the lower surface of the corresponding one of the particles, the meniscus corresponding to each of the plurality of raised portions.

12. The particle coated substrate of claim 1, wherein the cohesive polymer substrate has a substantially linear structure.

13. The particle coated substrate of claim 1, wherein the plurality of raised portions of the cohesive polymer substrate are formed when the particles are pressed on the cohesive polymer substrate.

* * * * *